(12) United States Patent
Michijima et al.

(10) Patent No.: US 6,442,064 B1
(45) Date of Patent: Aug. 27, 2002

(54) MAGNETIC TUNNEL JUNCTION ELEMENT AND MAGNETIC MEMORY USING THE SAME

(75) Inventors: Masashi Michijima, Soraku-gun; Hidekazu Hayashi, Tenri; Ryoji Minakata, Nara, all of (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/785,635

(22) Filed: Feb. 17, 2001

(30) Foreign Application Priority Data

Feb. 17, 2000 (JP) ........................ 2000-039167
Feb. 17, 2000 (JP) ........................ 2000-039168

(51) Int. Cl.$^7$ ................................ G11C 11/14
(52) U.S. Cl. ...................... 365/171; 365/173
(58) Field of Search ................ 365/171, 173, 365/97, 158

(56) References Cited

U.S. PATENT DOCUMENTS 5,841,692 A * 11/1998 Gallagher et al. ........ 365/173
5,953,248 A * 9/1999 Chen et al. .............. 265/158
6,211,559 B1 * 4/2001 Zhu et al. ................ 365/171

FOREIGN PATENT DOCUMENTS

JP  10-302456  11/1998
JP  10-302457  11/1998

* cited by examiner

*Primary Examiner*—Vu A. Le
(74) *Attorney, Agent, or Firm*—Dike Bronstein, Roberts & Cushman IP Group Edwards & Angell, LLP; David C. Conlin; David A Tucker

(57) ABSTRACT

A magnetic tunnel junction element includes a first magnetic layer and a second magnetic layer acting as a memory layer, and a first insulating layer sandwiched between the first and second magnetic layers. Further, the magnetic tunnel junction element includes a third magnetic layer on a side of the second magnetic layer opposite from the first insulating layer. This third magnetic layer constitutes a closed magnetic circuit together with the second magnetic layer.

11 Claims, 7 Drawing Sheets

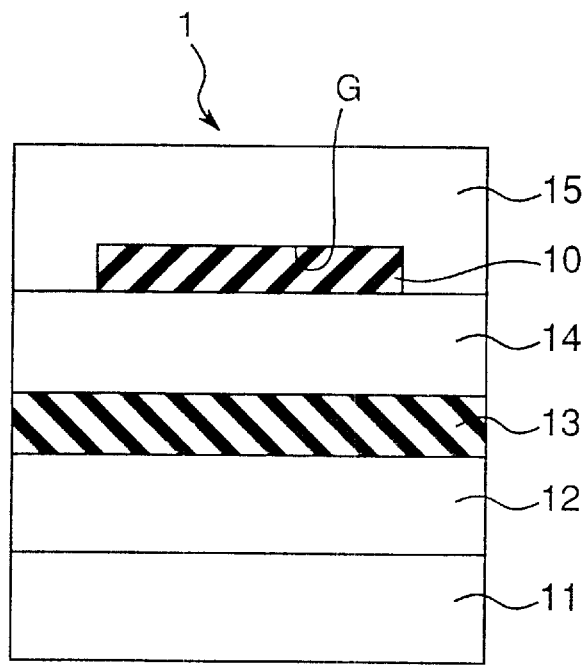
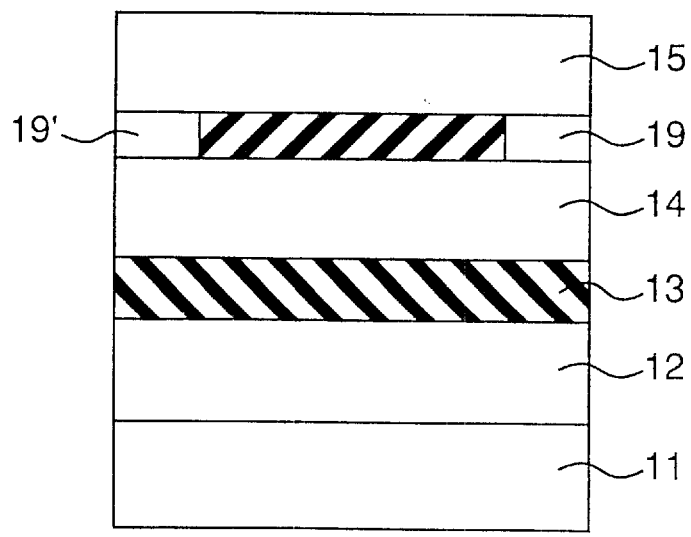

MAGNETIC TUNNEL JUNCTION ELEMENT AND MAGNETIC MEMORY USING THE SAME

BACKGROUND OF THE INVENTION

The present invention relates to a magnetic tunnel junction element and a magnetic memory using the same.

Recently, the application of magnetic tunnel junction (MTJ) elements to playback magnetic heads for hard disk drives (HDDs) and to magnetic memories has been considered and discussed because the MTJ elements provides a higher output, compared with conventional anisotropic magnetoresistive (AMR) elements and giant magnetoresistive (GMR) elements.

In particular, magnetic memories, which are solid state memories having no operating parts similar to semiconductor memories, are more useful than the semiconductor memories because of the following characteristics of their own: the information stored therein is not lost even if electric power is disconnected; the number of repetitive rewrites is infinite, namely, an infinite endurance is provided; there is no risk of destroying the recorded contents even if exposed to radioactive rays, etc.

As an example of the constitution of conventional MTJ elements, the one according to the teaching of JP-A-9-106514 is shown in FIG. 12.

The MTJ element in FIG. 12 is constituted of an antiferromagnetic layer 41, a ferromagnetic layer 42, an insulating layer 43, and a ferromagnetic layer 44. As the antiferromagnetic layer 41, an alloy such as FeMn, NiMn, PtMn or IrMn is used. As the ferromagnetic layers 42 and 44, Fe, Co, Ni or an alloy thereof is used. Further, as the insulating layer 43, various oxides and nitrides are being studied, and it is known that the highest magnetoresistance (MR) ratio is obtained when using an $Al_2O_3$ film.

In addition to this, there has been proposed an MTJ element with the antiferromagnetic layer 41 eliminated to utilize a difference in coercive force between the ferromagnetic layers 42 and 44.

FIG. 13 shows the principle of operation of the MTJ element having the constitution shown in FIG. 12 where the MTJ element is used for a magnetic memory.

The magnetizations of both the ferromagnetic layers 42 and 44 are within a film surface and have effective uniaxial magnetic anisotropy such that the magnetizations of these layers are parallel or antiparallel with each other. The magnetization of the ferromagnetic layer 42 is fixed substantially in one direction by the exchange coupling with the antiferromagnetic layer 41, and a recorded content is stored according to the direction of magnetization of the ferromagnetic layer 44.

The resistance of the MTJ element differs depending on whether the magnetization of the ferromagnetic layer 44 to serve as a memory layer is parallel or antiparallel to the direction of magnetization of the ferromagnetic layer 42. Utilizing the difference in magnetic resistance, information is read from the MTJ element by detecting its magnetic resistance. On the other hand, information is written to the MTJ element by changing the direction of magnetization in the ferromagnetic layer 44 using a magnetic field generated by current lines placed in the vicinity of the MTJ element.

In the MTJ element having the above constitution, the ferromagnetic layers 42 and 44 are magnetized parallel to the layer surfaces, and thus magnetic poles are generated at opposite end portions of these layer surfaces.

For increasing the packing density or integration degree in the magnetic memory, the size reduction of the MTJ elements is required. However, with the size reduction of the elements, an influence of the diamagnetic field due to the magnetic poles at the opposite end portions becomes greater.

Since the ferromagnetic layer 42 is exchange-coupled with the antiferromagnetic layer 41, the influence of the diamagnetic field upon the ferromagnetic layer 42 is small. Further, it is possible to substantially eliminate magnetic poles at the end portions by constituting the ferromagnetic layer 42 of two ferromagnetic layers that are antiferromagnetically coupled with each other as disclosed in U.S. Pat. No. 5841692.

However, as to the ferromagnetic layer 44 to serve as a memory layer, a similar technique cannot be applied. Thus, with finer patterns, the magnetization of the ferromagnetic layer 44 becomes unstable due to the influence of the magnetic poles at the end portions, which makes it difficult for the ferromagnetic layer 44 to hold a recorded content.

Japanese publication JP-A-11-163436 discloses that in order to realize an increase of output voltage, three ferromagnetic layers and two insulating layers are alternately laid on one another to thereby form two magnetic tunnel junctions in an MTJ element. This MTJ element provides an output that is about twice of that of an MTJ element having a single magnetic tunnel junction. However, since the three ferromagnetic layers are magnetized along their layer surfaces, there arises a problem similar to the above-described problem inherent in the MTJ element of FIG. 12.

Further, with the reduction in the area of a memory cell in a magnetic thin film memory, it becomes impossible to ignore the diamagnetic field (self-demagnetizing field) that will occur inside the magnetic layer. Due to this, the magnetization of the magnetic layer that stores information is not fixed in one direction, thus becoming unstable. As a solution to this problem, Japanese Patent Publications JP-A-10-302456 and JP-A-10-302457 disclose to provide a laminated film consisting of a first magnetic layer, a non-magnetic layer and a second magnetic layer, which all together form a memory cell, with a third magnetic layer at both sides of the laminated film, so as to form a closed magnetic circuit surrounding the non-magnetic layer by the first, second and third magnetic layers when an external magnetic field is zero.

A magnetic tunnel junction element in which an extremely thin insulating film is formed as the non-magnetic layer of the laminated film exhibits a great change in magnetoresistance, and thus the element is regarded as a promising memory cell having a high output. In this case, the third layer is required to be formed of an insulating material. However, an insulative magnetic layer having a coercive force low enough to realize a closed magnetic circuit structure is extremely difficult to form with a currently available technique. Accordingly, it is unrealistic.

SUMMARY OF THE INVENTION

An object of the present invention is to provide a magnetic tunnel junction element that enables a magnetization state recorded in the memory layer to exist stably even if finer patterns are used, and also to provide a magnetic memory using such a magnetic tunnel junction element.

In order to accomplish the above object, a magnetic tunnel junction element according to an aspect of the present invention comprises:

a first magnetic layer and a second magnetic layer acting as a memory layer;

a first insulating layer disposed between the first and second magnetic layers; and a third magnetic layer provided on a side of the second magnetic layer opposite from the first insulating layer so as to form a closed magnetic circuit together with the second magnetic layer.

According to the present invention, the influence of the end-portion magnetic poles is reduced. Therefore, even if a finer pattern is used for the magnetic tunnel junction (MTJ) element, the magnetized state is retained stably. Further, because the ferromagnetic layer to serve as a memory layer forms a closed magnetic circuit structure, the MTJ element of the present invention becomes stable to an external leakage magnetic field.

Further, since the MTJ element of the present invention can stably retain the magnetized state thanks to the reduced influence of the magnetic poles at the end portions even if a finer patter therefor is used, it is possible to realize a magnetic memory having a higher integration degree and consuming less power.

In one embodiment, the third magnetic layer is joined to the second magnetic layer at opposite ends thereof directly or through fourth magnetic layers, with a central portion of the third magnetic layer spaced from the second magnetic layer.

A lead wire may be disposed within a gap defined between the second magnetic layer and the central portion of the third magnetic layer, through an insulating layer.

The MTJ element may further include a first antiferromagnetic layer in contact with a face of the first magnetic layer opposite from the first insulating layer, wherein the first antiferromagnetic layer is exchange-coupled with the first magnetic layer.

The first magnetic layer may be constituted of at least two ferromagnetic sub-layers which are antiferromagnetically coupled with each other through a metal layer.

In one embodiment, the MTJ element further includes:

a fifth magnetic layer formed on a side of the third magnetic layer opposite from the first magnetic layer; and a second insulating layer disposed between the third and fifth magnetic layers.

This MTJ element may further include:

a first antiferromagnetic layer in contact with a face of the first magnetic layer opposite from the first insulating layer, said first antiferromagnetic layer being exchange-coupled with the first magnetic layer; and a second antiferromagnetic layer in contact with a face of the fifth magnetic layer opposite from the second insulating layer, said second antiferromagnetic layer being exchange-coupled with the fifth magnetic layer.

When the MTJ element includes the first and second antiferromagnetic layers, it is preferable that a temperature at which the exchange coupling of the first antiferromagnetic layer with the first ferromagnetic layer disappears is different from a temperature at which the exchange coupling of the second antiferromagnetic layer with the fifth ferromagnetic layer disappears.

A magnetic memory according to another aspect of the present invention uses the MTJ element having the above-described structure as a memory cell. Accordingly, the magnetic memory has a high integration degree and consumes a reduced power.

Other objects, features and advantages of the present invention will be obvious from the following description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 1 shows a constitution example of the MTJ element according to the present invention;

FIG. 2 shows another constitution example of the MTJ element according to the present invention;

DETAILED DESCRIPTION OF THE PREFERRED EMBODIMENTS

EXAMPLE 1

Figure 3:
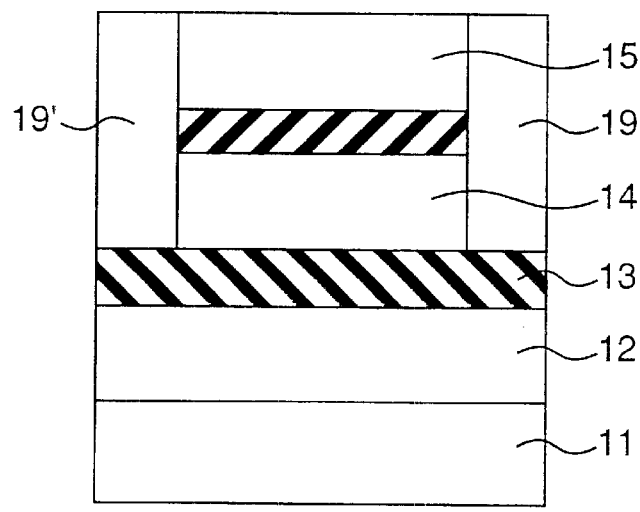
FIG. 3 shows still another constitution example of the MTJ element according to the present invention.

FIG. 1 shows a constitution example of the MTJ element according to the present invention.

As shown in FIG. 1, an MTJ element 1 in Example 1 of the present invention has an antiferromagnetic layer 11, a ferromagnetic layer 12, an insulating layer 13, a ferromagnetic layer 14 serving as a memory layer, a non-magnetic layer 10, and a closed magnetic circuit forming layer (ferromagnetic layer) 15. The ferromagnetic layer 14 and the closed magnetic circuit forming layer (ferromagnetic layer) 15 are directly joined to each other at both of their opposite end portions, but are separated or spaced from each other at their central portions to define a gap G therebetween. The gap G is filled with the non-magnetic layer (an insulating layer in this example) 10.

As shown in FIG. 1, by laying the closed magnetic circuit forming layer (ferromagnetic layer) 15 on the ferromagnetic layer 14, the magnetizations of the ferromagnetic layer 14 and the closed magnetic circuit forming layer 15 constitute a closed loop. This makes it possible to avoid the generation of magnetic poles at end portions of the ferromagnetic layer 14.

Further, the antiferromagnetic layer 11 and the ferromagnetic layer 12 are exchange-coupled with each other. the direction of magnetization of the ferromagnetic layer 12 is fixed.

As the material of the antiferromagnetic layer 11, an alloy such as FeMn, NiMn, PtMn or IrMn can be used. As the materials of the ferromagnetic layers 12, 14, and the closed magnetic circuit forming layer (ferromagnetic layer) 15, metals such as Fe, Co, and Ni or alloys thereof may be used. Further, as a material of the insulating layer 13, an $Al_2O_3$ film is preferable in view of MR ratios. Alternatively, the insulating layer 13 may be formed of other oxide or nitride. Further, a Si film, a diamond film, or a diamond-like carbon (DLC) film may be also used.

It is preferable that the ferromagnetic layers 12, 14 and the closed magnetic circuit-forming layer (ferromagnetic layer) 15 have film thicknesses of at least 10 Å. The reason thereof is that, when the film thickness is too small, these ferromagnetic layers tend to become superparamagnetic due to an influence of thermal energy.

Further, preferably, the insulating layer 13 has a film thickness in the range of from 3 Å to 30 Å. The reason thereof is as follows. When the insulating layer 13 has a film thickness of less than 3 Å, there is a possibility that the ferromagnetic layer 12 and the ferromagnetic layer 14 are short-circuited. On the other hand, when the insulating layers 13 has a film thickness of more than 30 Å, tunneling of electrons hardly occurs, resulting in a decrease of in magnetoresistance (MR) ratios.

The MTJ element 1 in Example 1 may also have a structure in which the ferromagnetic layer 14 and the closed magnetic circuit forming layer (ferromagnetic layer) 15 are joined to each other at their end portions through ferromagnetic layers 19, 19', with their central portions separated from each other by the non-magnetic layer 10, as shown in FIGS. 2 and 3. In an example shown in FIG. 2, the ferromagnetic layers 19, 19' are individually provided between the opposed surfaces of the ferromagnetic layer 14 and closed magnetic circuit forming layer 15. In an example of FIG. 3, the ferromagnetic layers 19, 19' are individually provided in contact with opposite side faces of the ferromagnetic layer 14 and the closed magnetic circuit forming layer 15.

Figure 4:
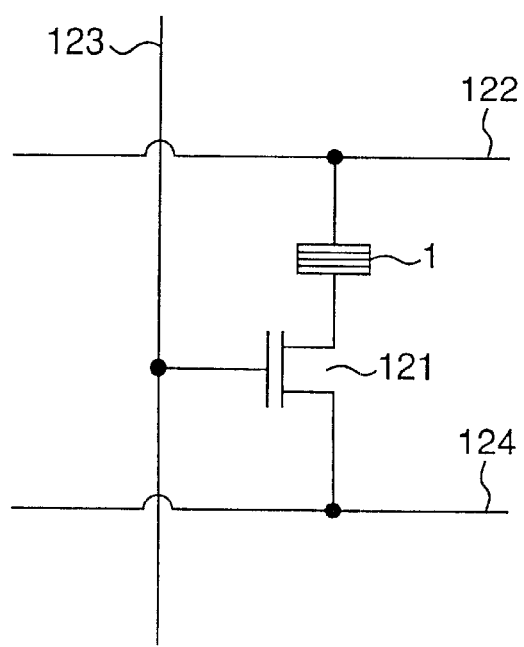
FIG. 4 shows a constitution example of a magnetic memory using the MTJ element according to the present invention as a memory cell.

FIG. 4 schematically shows an essential part of a randomly accessible magnetic memory cell which uses the MTJ element 1 of the invention as a memory cell. Although the magnetic memory actually includes a lot of memory cells, only a part including one memory cell is shown in FIG. 4 for the sake of simplicity.

A transistor 121 has a role of selecting the associated MTJ element 1 at the time of reading information. Information of "0" or "1" has been recorded in the MTJ element 1 according to the magnetization direction of the ferromagnetic layer 14 of the MTJ element 1. The magnetization direction of the ferromagnetic layer 12 is fixed. The information is read using the magnetoresistance effect that the resistance value is low when the magnetizations of the ferromagnetic layers 12 and 14 are parallel to each other, while the resistance value is high when they are antiparallel from each other. On the other hand, writing is realized by reversing the directions of magnetization of the ferromagnetic layer 14 and the closed circuit layer (ferromagnetic layer) 15 with the resultant magnetic field generated by a bit line 122 and a word line 123. Incidentally, reference numeral 124 indicates a plate line.

Figure 5:
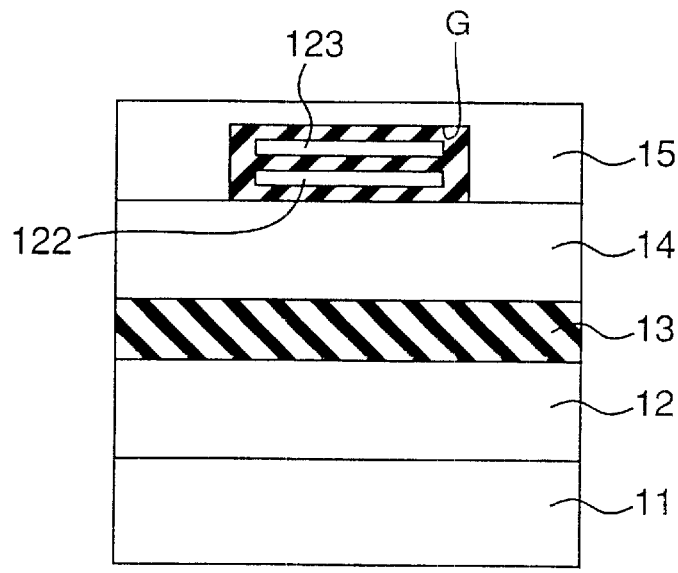
FIG. 5 shows a placement example of a word line and a bit line in a magnetic memory using the MTJ element according to the present invention as a memory cell.

FIG. 5 shows an example of the placement of the bit line (lead wire) 122 and the word line (lead wire) 123. In FIG. 5, the bit line 122 and the word line 123 are placed within the central gap G through the insulating film 10. By so doing, a current intensity required for reversing the direction of magnetization of the ferromagnetic layer 14 and closed magnetic circuit (ferromagnetic layer) 15 is reduced. Thus, the power consumption of the magnetic memory can be reduced. In the FIG. 5 example, the word line 123 is placed above the bit line 122.

The placement of the bit line and the word line is not limited to the one shown in FIG. 5. It is also possible to provide the bit line and the word line so as to be coplanar with each other. Alternatively, both or either of the lines may be provided outside the MTJ element and in its vicinity, which would lead to the simplification of the production process.

Further, in FIG. 5, both of the bit line 122 and the word line 123 are electrically insulated from the ferromagnetic layer 14 and the closed magnetic circuit forming layer (ferromagnetic layer) 15 by the insulating layer 10. Alternatively, either one of the lines may be electrically connected to the ferromagnetic layer 14 and the closed magnetic circuit forming layer (ferromagnetic layer) 15 to serve as an electrode for detecting a change in resistance.

Although the magnetization of the ferromagnetic layer 12 is fixed by an exchange coupling with the antiferromagnetic layer 11, it is possible to take other measures such as using a ferromagnetic material having a large coercive force.

If the ferromagnetic layer 12 is constituted of two ferromagnetic layers that are antiferromagnetically coupled with each other via a metal layer, an influence of the magnetic poles that would occur at end portions of the ferromagnetic layer 12 can be reduced. The reduction of the influence of the end-portion magnetic poles is also achieved by constituting the ferromagnetic layer 12 of a ferromagnetic material such as a rare earth-transition metal alloy having the composition around a compensation point or composition.

It is also possible to stack the respective layers in the order reverse to the case in FIG. 1.

Although the closed magnetic circuit structure is formed for only one of the ferromagnetic layers (namely, ferromagnetic layer 14), it may also be formed for both of the ferromagnetic layers (ferromagnetic layers 12 and 14). When the closed circuit structure is provided to the ferromagnetic layer 12, the closed magnetic circuit-forming layer is placed underneath the ferromagnetic layer 12.

EXAMPLE 2

Figure 6:
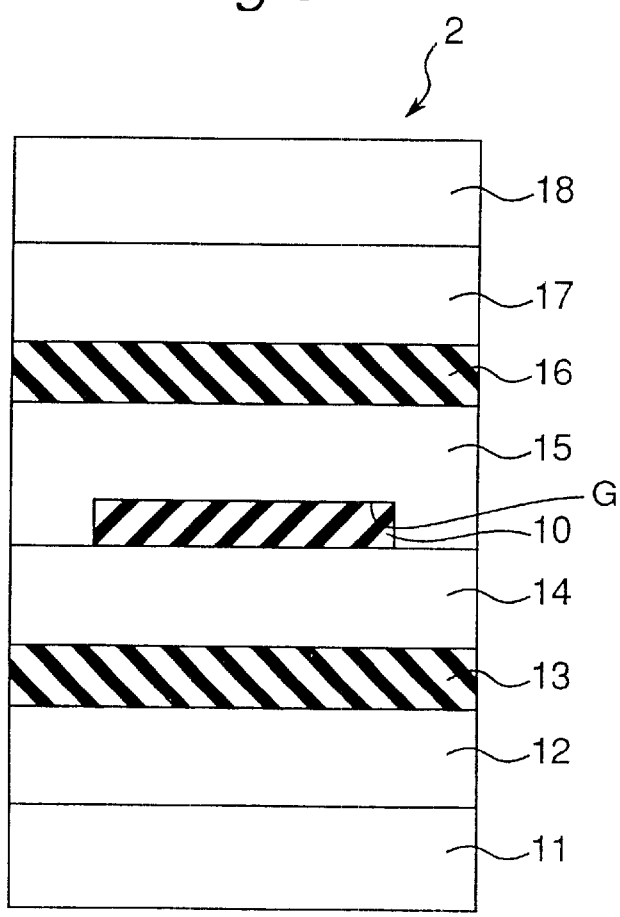
FIG. 6 shows another constitution example of the MTJ element according to the present invention.

FIG. 6 shows the structure of an MTJ element 2 in Example 2 according to the present invention.

The MTJ element 2 in FIG. 6 is constituted by further providing an insulating layer 16, a ferromagnetic layer 17 and an antiferromagnetic layer 18 on the closed magnetic circuit forming layer 15 of the MTJ element 1 in FIG. 1. That is, in FIG. 6, the MTJ element 2 has an antiferromagnetic layer 11, a ferromagnetic layer 12, an insulating layer 13, a ferromagnetic layer 14 serving as a memory layer, a non-magnetic layer 10, a closed magnetic circuit forming layer (ferromagnetic layer) 15, an insulating layer 16, a ferromagnetic layer 17, and an antiferromagnetic layer 18. The ferromagnetic layer 14 and the closed magnetic circuit forming layer (ferromagnetic layer) 15 are directly joined to each other at both of their end portions, but separated or spaced from each other at their central portions so as to define a gap G therebetween. The gap G is filled with the non-magnetic layer (an insulating layer in this example) 10.

As described above in connection with Example 1, laying the closed magnetic circuit forming layer (ferromagnetic layer) 15 on the ferromagnetic layer 14 allows the magnetizations of these two layers 14 and 15 to form a closed loop. As a result, it is possible to avoid the generation of the magnetic poles at end portions of the ferromagnetic layer 14.

Further, the antiferromagnetic layer 11 and the ferromagnetic layer 12 are exchange-coupled with each other, and the antiferromagnetic layer 18 and the ferromagnetic layer 17 are also exchange-coupled with each other, so that the directions of magnetization of the ferromagnetic layers 12 and 17 are fixed.

As the materials of the ferromagnetic layers 12, 14, 17 and the closed magnetic layer (ferromagnetic layer) 15, a metal of Fe, Co or Ni or an alloy thereof can be used. As the materials of the antiferromagnetic layers 11 and 18, an alloy such as FeMn, NiMn, PtMn or IrMn can be used.

As the insulating layers 13 and 16, an $Al_2O_3$ film is preferred in view of the rate of change in resistance, though other oxide and nitride may also be used. Further, an insulator having covalent bonds such as a Si film, a diamond film and a diamond-like carbon (DLC) film may also be used.

The MTJ element 2 holds or stores information in the form of the magnetization direction of the closed loop made by the ferromagnetic layer 14 and the closed magnetic circuit forming layer (ferromagnetic layer) 15. The stored information is read by detecting a change in resistance caused by that the magnetization direction of the closed loop, made by the ferromagnetic layer 14 and the closed circuit layer (ferromagnetic layer) 15 is parallel or antiparallel to the magnetization directions of the ferromagnetic layers 12 and 17.

As is obvious, since the stored content is represented by the magnetization direction of the closed loop constituted of the ferromagnetic layer 14 and the closed magnetic circuit forming layer (ferromagnetic layer) 15, the magnetizations of the ferromagnetic layers 12 and 17 must be fixed in opposite directions by exchange coupling with the antiferromagnetic layers 11 and 18, respectively.

Such magnetization is realized by using, for the antiferromagnetic layers 11, 18, materials having different temperatures (blocking temperatures) Tbs at which the exchange coupling disappears.

For instance, an example where a PtMn film is used as the antiferromagnetic layer 11, while an IrMn film is used as the antiferromagnetic layer 18 is used, will be described below. The PtMn is an antiferromagnetic material having an AuCu I type ordered phase and has a blocking temperature Tb1 of 380° C. On the other hand, the IrMn is an antiferromagnetic material having a face-centered cubic structure and has a blocking temperature Tb2 of 270° C.

The ferromagnetic layers 14, 15, 12 and 17 are magnetized in the following manner. First, in order to order the antiferromagnetic layer 11 made of a PtMn film, after having formed all the layers 11–18 in the same vacuum, these layers are subjected to heat treatment at 250° C. for 6 hours while applying a magnetic field in one direction. As a result, the PtMn film (antiferromagnetic layer 11) is ordered, and during the process of cooling the spins in this film are arrayed while being influenced by the magnetization of the ferromagnetic layer 12 oriented to the direction of the applied magnetic field. The consequent exchange coupling fixes or locks up the magnetization of the ferromagnetic layer 12 in the direction of the applied magnetic field.

Next, the layers are again heated to a temperature between Tb2 and Tb1, and then cooled (180°) while applying a magnetic field in a direction opposite to the direction of the magnetic field applied in the first heat treatment. During the process of cooling, the spins in the antiferromagnetic layer 18 made of an IrMn film are re-arrayed while being influenced by the magnetization of the adjacent ferromagnetic layer 17 oriented in the opposite direction. As a result, the magnetization of the adjacent ferromagnetic layer 17 is fixed in a direction antiparallel to the direction in which the ferromagnetic layer 17 was magnetized in the first heat treatment.

At this time, since the temperature of the second heat treatment is lower than TB1, the initial directions of magnetization of the PtMn antiferromagnetic layer 11 and the associated ferromagnetic layer 12 achieved by the first treatment are maintained, without being influenced by the second heat treatment. As a result, the magnetization directions of the ferromagnetic layers 12 and 17 become antiparallel to each other.

The materials of the antiferromagnetic layers and the magnetization orientation method are not limited to the above as long as the two antiferromagnetic layers have different blocking temperatures Tb (TB1 and Tb2). Further, as the orientation method of magnetization, in addition to the method in which the antiferromagnetic layer is subjected to heat treatment in a magnetic field, the orientation of magnetization can also be realized by controlling magnetization directions at the time of film formation or using the above methods in combination. It would be apparent to those having ordinary skill in the art that using a film of disordered alloy as an antiferromagnetic layer dispenses with the heat treatment for ordering the film, unlike the case in which a film of ordered alloy is used.

It is preferable that the ferromagnetic layers 12, 14, and 17 and the closed magnetic circuit-forming layer (ferromagnetic layer) 15 have film thicknesses of at least 10 Å. The reason thereof is that, when the film thickness is too small, these ferromagnetic layers would become superparamagnetic by the influence of thermal energy.

Further, it is preferable that the insulating layers 13 and 16 have a film thickness in the range of 3 to 30 Å inclusive. The reason thereof is as follows. If the insulating layers 13 and 16 have a film thickness of less than 3 Å, there is a possibility that the ferromagnetic layer 12 and the ferromagnetic layer 14 or the closed magnetic circuit forming layer 15 and the ferromagnetic layer 17 are electrically short circuited. On the other hand, when the insulating layers 13 and 16 have a film 10 thickness of more than 30 Å, tunneling of electrons hardly occurs, resulting in the reduction of magnetoresistance ratios.

Further, as described below, by constituting the ferromagnetic layer 12 and/or 17 of two ferromagnetic layers, it is possible to effectively prevent the generation of magnetic poles at end portions thereof. Even if the ferromagnetic layer consists of three or more layers, it is possible to effectively prevent the generation of magnetic poles at the end portions by adjusting the thicknesses of the constituent ferromagnetic layers.

Figure 7:
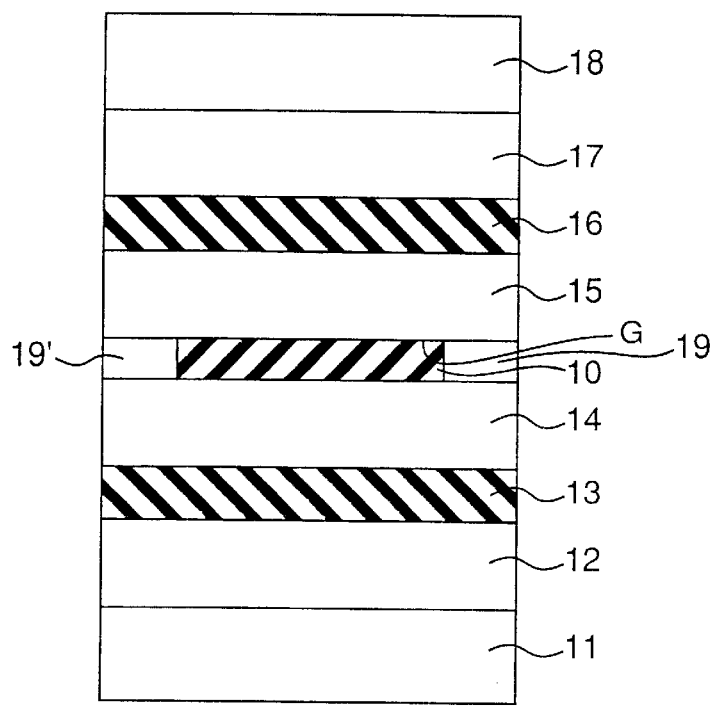
FIG. 7 shows still another constitution example of the MTJ element according to the present invention.
Figure 8:
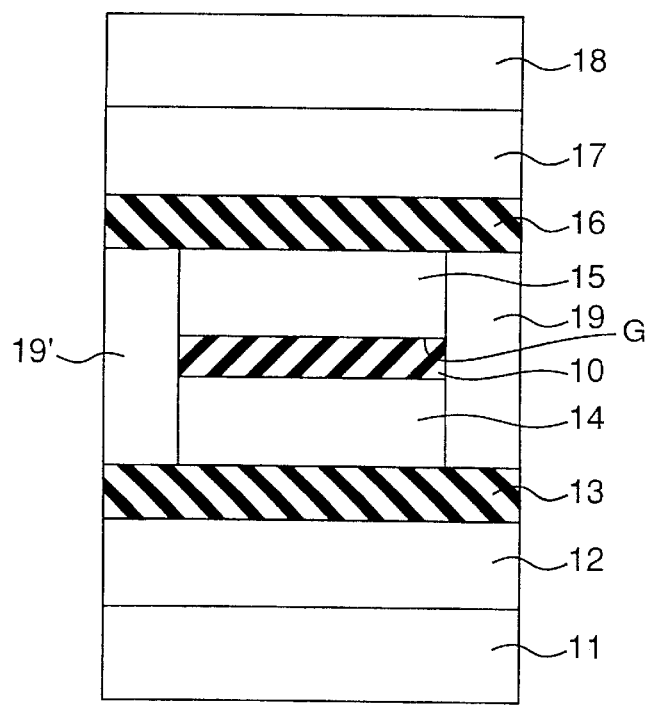
FIG. 8 shows a further construction example of the MTJ element according to the present invention.

Further, for the MTJ element 2 of the present example, it is also possible to adopt a structure as shown in FIGS. 7 and 8 where the ferromagnetic layer 14 and the closed magnetic circuit forming layer (ferromagnetic layer) 15 are joined to each other at their opposite end portions through respective ferromagnetic layers 19, 19', but separated or spaced from each other at their central portions.

Figure 9:
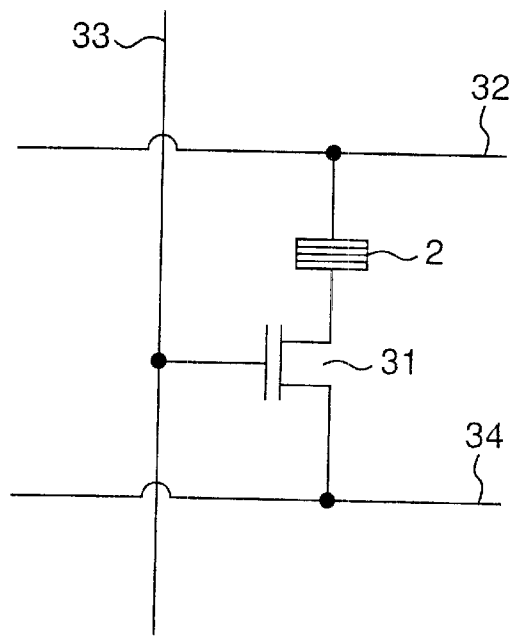
FIG. 9 shows a constitution example of a magnetic memory using the MTJ element according to the present invention as a memory cell.

FIG. 9 schematically shows an essential part of a randomly accessible magnetic memory cell which uses the MTJ element 2 of the invention as a memory cell. Although the magnetic memory actually includes a lot of memory cells, only a part including one memory cell is shown in FIG. 9 for the sake of simplicity.

A transistor 31 has a role of selecting the associated MTJ element 2 at the time of reading information. Information of "0" or "1" has been recorded in the MTJ element 2 of FIG. 6 as the magnetization direction of the ferromagnetic layer 14 of the MTJ element 2. The magnetization directions of the ferromagnetic layers 12 and 14 are fixed. The information is read using the magnetoresistance effect that the resistance value is low when the magnetizations of the ferromagnetic layers 12 and 14 are parallel and the magnetizations of the ferromagnetic layer 17 and the closed magnetic circuit forming layer (ferromagnetic layer) 15 are also parallel, while the resistance value is high when they are antiparallel. On the other hand, writing is performed by reversing the directions of magnetization of the ferromagnetic layer 14 and the closed circuit layer (ferromagnetic layer) 15 with the resultant magnetic field generated by a bit line 32 and a word line 33. In FIG. 9, reference numeral 34 indicates a plate line.

Figure 10:
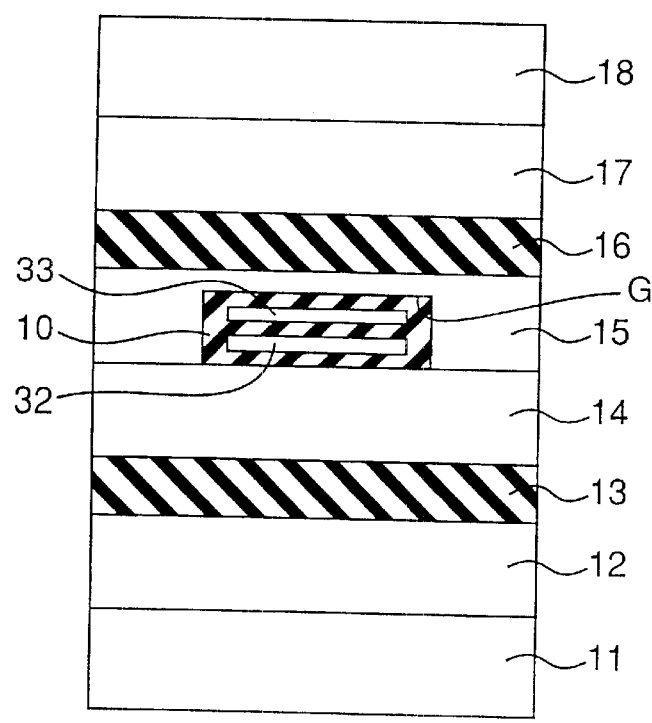
FIG. 10 shows a placement example of a word line and a bit line in a magnetic memory utilizing the MTJ element according to the present invention as a memory cell.

FIG. 10 shows an example of the placement of the bit line 32 and the word line 33.

In FIG. 10, the bit line 32 and the word line 33 are placed within the central gap G through the insulating film 10. By so doing, a current intensity required for reversing the direction of magnetization of the ferromagnetic layer 14 and closed magnetic circuit (ferromagnetic layer) 15 is reduced, as described above. Thus, the power consumption of the magnetic memory can be reduced. In the FIG. 10 example, the word line 33 is placed above the bit line 32.

Further, the bit line 32 and the word line 33 are electrically insulated from each other and also from the ferromagnetic layer 14 and the closed magnetic circuit forming layer (ferromagnetic layer) 15 by the insulating layer 10.

The placement of the bit line and the word line is not limited to the manner shown in FIG. 10. It is also possible to place the bit line and the word line so as to be coplanar to each other. Alternatively, both or either of the lines may be provided outside the MTJ element and in its vicinity, which would lead to the simplification of the production process.

EXAMPLE 3

Figure 11:
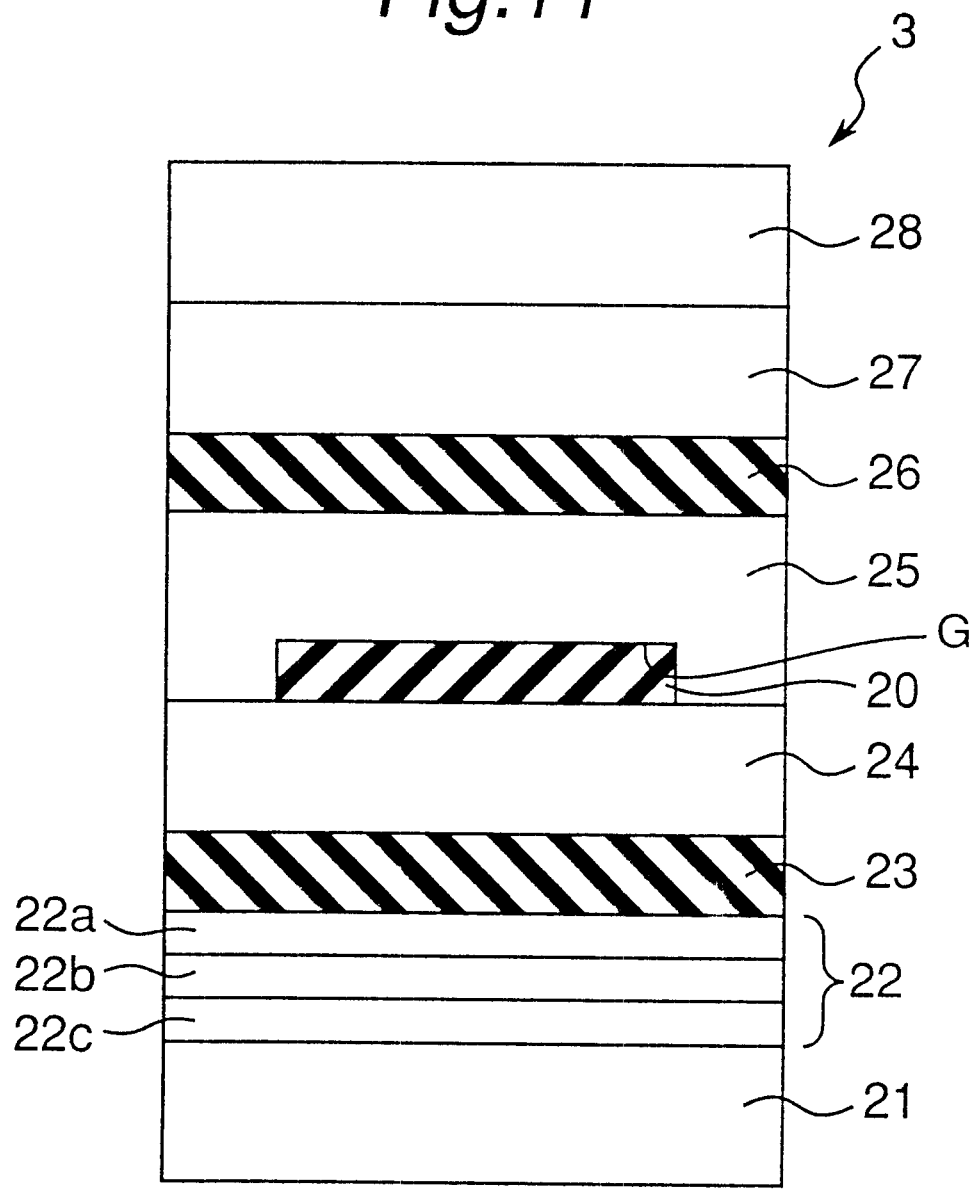
FIG. 11 shows still another constitution example of the MTJ element according to the present invention.
Figure 12:
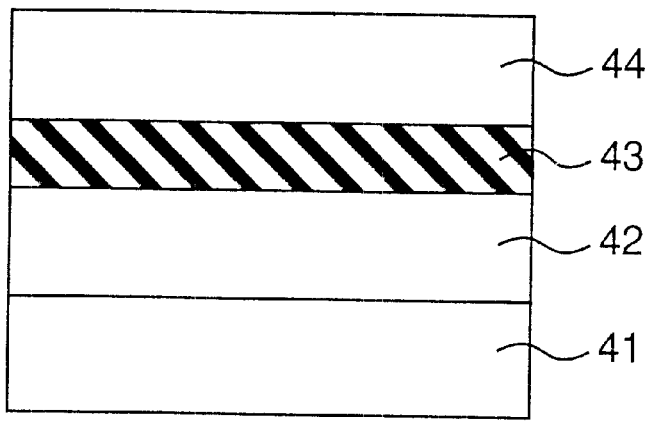
FIG. 12 shows a constitution example of a conventional MTJ element.
Figure 13:
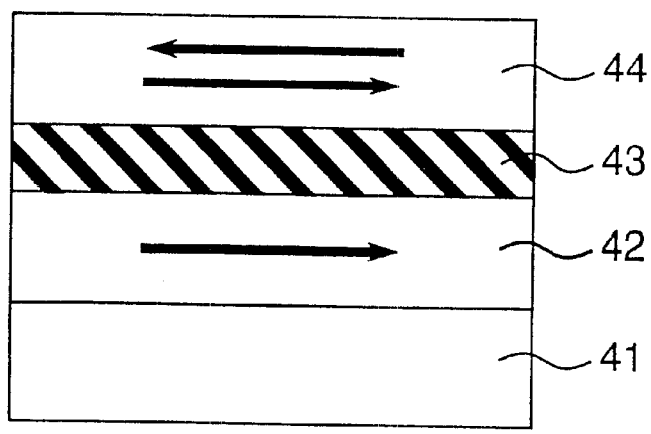
FIG. 13 shows the principle of operation of the conventional MTJ element used for a magnetic memory.

FIG. 11 shows the constitution of a MTJ element in Example 3.

In FIG. 11, an MTJ element 3 is essentially constituted of an antiferromagnetic layer 21, a ferromagnetic layer 22, an insulating layer 23, a ferromagnetic layer 24 serving as a memory layer, a non-magnetic layer 20, a closed magnetic circuit forming layer (ferromagnetic layer) 25, a non-magnetic layer 20, an insulating layer 26, a ferromagnetic layer 27, an antiferromagnetic layer 28. The ferromagnetic layer 24 and the closed magnetic circuit forming layer (ferromagnetic layer) 25 are directly joined to each other at their opposite end portions, but separated or spaced from each other at their central portions so as to define a gap G therebetween as in the previous examples. The gap G is filled with the non-magnetic layer (an insulating layer in this example) 20.

Laying the closed magnetic circuit forming layer (ferromagnetic layer) 25 on the ferromagnetic layer 24 in a manner shown in FIG. 11 allows the magnetizations of these two layers 24 and 25 to form a closed loop. As a result, it is possible to avoid the generation of the magnetic poles at opposite end portions of the ferromagnetic layer 24.

Different from the MTJ element 2 in Example 2, in the MTJ element 3 in Example 3, the ferromagnetic layer 22 includes two ferromagnetic layers 22a and 22a that are antiferromagnetically coupled with each other through a metal layer 22b. The ferromagnetic layer 22a is exchange-coupled with the antiferromagnetic layer 21. Further, similar to Example 2, the antiferromagnetic layer 28 and the ferromagnetic layer 27 are exchange-coupled with each other.

That is, the ferromagnetic layer 27 is a fixed layer in which its magnetization is fixed by exchange coupling with the antiferromagnetic layer 28. The magnetization of the ferromagnetic layer 22c is fixed by exchange coupling with the antiferromagnetic layer 21. Further, the ferromagnetic layer 22a is antiferromagnetically coupled with the ferromagnetic layer 22c through the metal layer 22b, so that the magnetization of the ferromagnetic layer 22a is fixed in a direction opposite to that of the ferromagnetic layer 22c.

The MTJ element 3 stores information in accordance with the magnetization direction of the closed loop made of the ferromagnetic layer 24 and the closed magnetic circuit forming layer (ferromagnetic layer) 25. The stored information is read by detecting a change in resistance caused by the magnetization direction of the closed loop, made of the ferromagnetic layer 24 and the closed circuit layer (ferromagnetic layer) 25, which is parallel or antiparallel to the magnetization directions of the ferromagnetic layers 22a and 27.

In order to read the stored information by detecting such a change in resistance, the magnetization direction of the ferromagnetic layer 22c must be fixed in the same direction as that of the ferromagnetic layer 27.

Therefore, according to Example 3, one-time treatment or application of the same direction of the magnetic field enables the magnetization directions of the ferromagnetic layers 22 and 27 to be fixed. Therefore, the process can be simplified compared with Example 2.

In Example 3, the ferromagnetic layer or film 22 is constituted of two ferromagnetic sub-layers with a metal layer interposed therebetween, and the ferromagnetic film 27 is constituted of a single layer. However, the same effect can be obtained even if both the ferromagnetic films 22 and 27 include two or more ferromagnetic sub-layers as long as the two ferromagnetic films 22 and 27 to serve as fixed layers are formed such that the number of ferromagnetic sub-layers is different by one between the films 22 and 27.

Further, in Example 3, an identical antiferromagnetic material can be used for the antiferromagnetic layers 21 and 28.

Furthermore, in Example 3, similar to Example 2 (FIGS. 7 and 8), the MTJ element may also have a structure where the ferromagnetic layer 24 and the closed magnetic circuit forming layer (ferromagnetic layer) 25 are joined to each other at their opposite end portions through other ferromagnetic layers, but separated or spaced at their central portions.

Similar to the MTJ elements 1 and 2, the MTJ element 3 may be used for a magnetic memory.

Although in Examples 1–3, only an essential part of the MTJ elements 1–3 is shown and explained in the above description, it is believed to be apparent to those having ordinary skill in the art that in actually producing the element or device, provision of other constituent parts such as electrodes for supplying electric current, a substrate, a protective layer, an adhesion layer, etc. is required.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A magnetic tunnel junction element comprising:
   a first magnetic layer and a second magnetic layer acting as a memory layer;
   a first insulating layer disposed between the first and second magnetic layers; and
   a third magnetic layer provided on a side of the second magnetic layer opposite from the first insulating layer so as to form a closed magnetic circuit together with the second magnetic layer;
   wherein the third magnetic layer is joined to the second magnetic layer at opposite ends thereof directly or through fourth magnetic layers, with a central portion of the third magnetic layer spaced from the second magnetic layer.

2. The magnetic tunnel junction element according to claim 1, wherein a lead wire is disposed within a gap defined between the second magnetic layer and the central portion of the third magnetic layer, through an insulating layer.

3. The magnetic tunnel junction element according to claim 1, further comprising:
   a first antiferromagnetic layer in contact with a face of the first magnetic layer opposite from the first insulating layer, said first antiferromagnetic layer being exchange-coupled with the first magnetic layer.

4. The magnetic tunnel junction element according to claim 1, wherein the first magnetic layer is constituted of at least two ferromagnetic sub-layers which are antiferromagnetically coupled with each other through a metal layer.

5. The magnetic tunnel junction element according to claim 1, further comprising:
   a fifth magnetic layer formed on a side of the third magnetic layer opposite from the first magnetic layer; and
   a second insulating layer disposed between the third and fifth magnetic layers.

6. The magnetic tunnel junction element according to claim 5, further comprising:
   a first antiferromagnetic layer in contact with a face of the first magnetic layer opposite from the first insulating layer, said first antiferromagnetic layer being exchange-coupled with the first magnetic layer; and
   a second antiferromagnetic layer in contact with a face of the fifth magnetic layer opposite from the second insulating layer, said second antiferromagnetic layer being exchange-coupled with the fifth magnetic layer.

7. The magnetic tunnel junction element according to claim 6, wherein a temperature at which the exchange coupling of the first antiferromagnetic layer with the first ferromagnetic layer disappears is different from a temperature at which the exchange coupling of the second antiferromagnetic layer with the fifth ferromagnetic layer disappears.

8. The magnetic tunnel junction element according to claim 7, wherein at least one of the first magnetic layer and the fifth magnetic layer is constituted of at least two ferromagnetic sub-layers which are antiferromagnetically coupled with each other through a metal layer.

9. The magnetic tunnel junction element according to claim 7, wherein the third magnetic layer is joined to the second magnetic layer at opposite ends thereof directly or through fourth magnetic layers, with a central portion of the third magnetic layer spaced from the second magnetic layer.

10. The magnetic tunnel junction element according to claim 9, wherein a lead wire is disposed within a gap defined between the second magnetic layer and the central portion of the third magnetic layer, through an insulating layer.

11. A magnetic memory using, as a memory cell, the magnetic tunnel junction element according to claim 1.

* * * * *